United States Patent
Lee

(10) Patent No.: US 8,507,349 B2
(45) Date of Patent: Aug. 13, 2013

(54) SEMICONDUCTOR DEVICE EMPLOYING FIN-TYPE GATE AND METHOD FOR MANUFACTURING THE SAME

(75) Inventor: Seung Hyun Lee, Seoul (KR)

(73) Assignee: Hynix Semiconductor Inc, Icheon (KR)

( * ) Notice: Subject to any disclaimer, the term of this patent is extended or adjusted under 35 U.S.C. 154(b) by 188 days.

(21) Appl. No.: 12/842,598

(22) Filed: Jul. 23, 2010

(65) Prior Publication Data

US 2011/0127611 A1    Jun. 2, 2011

(30) Foreign Application Priority Data

Nov. 30, 2009  (KR) .................. 10-2009-0117118

(51) Int. Cl.
*H01L 21/336*    (2006.01)

(52) U.S. Cl.
USPC ............................. 438/294; 438/212; 438/268

(58) Field of Classification Search
USPC ............ 257/329, 330, 368, E21.41, E29.262; 438/212, 268, 294
See application file for complete search history.

(56) References Cited

U.S. PATENT DOCUMENTS

2006/0220131 A1    10/2006    Kinoshita et al.
2008/0299734 A1 *  12/2008    Lee et al. ...................... 438/300

FOREIGN PATENT DOCUMENTS

| KR | 1020060027640 | * | 3/2006 |
| KR | 1020060027640 | A | 3/2006 |

* cited by examiner

*Primary Examiner* — A. Sefer
*Assistant Examiner* — Farid Khan

(57) ABSTRACT

A semiconductor device comprises an active region having an upper portion and a sidewall portion which are protruded from the top surface of a device isolation region, and a silicide film disposed in the upper portion and the sidewall portion of the active region, thereby effectively reducing resistance in a source/drain region of the semiconductor device. As a result, the entire resistance of the semiconductor device comprising a fin-type gate can be reduced to improve characteristics of the semiconductor device.

10 Claims, 6 Drawing Sheets

SEMICONDUCTOR DEVICE EMPLOYING FIN-TYPE GATE AND METHOD FOR MANUFACTURING THE SAME

CROSS-REFERENCE TO RELATED APPLICATION

The priority of Korean patent application No. 10-2009-0117118 filed on Nov. 30, 2009, the disclosure of which is hereby incorporated in its entirety by reference, is claimed.

BACKGROUND OF THE INVENTION

Embodiments of the present invention generally relate to a semiconductor device comprising of a fin-type gate, and more specifically, to a semiconductor device and a method for manufacturing the same that can effectively reduce the resistance of a source and drain of an active region.

Due to the high integration of semiconductor devices, a process margin for forming an active region and a device isolation region has been reduced. Specifically, as a semiconductor device is manufactured with lower-power or higher-speed elements, a gate width has been narrowed and a channel length has been reduced. This reduction will degrade an electrical characteristic of the semiconductor device and result in a short channel effect. As a result, methods to improve the reliability of the device have been required.

Of these methods, a multi-channel field effect transistor (McFET) such as a recess gate and a fin-type gate has been used. The recess gate is obtained by etching a given depth of a semiconductor substrate of a gate expected region to increase a channel length. The fin-type gate increases the contact area between the active region and the gate to improve the driving capacity of the gate and the electrical characteristics of the device.

A fin-type transistor has a fin channel structure where a three-side gate surrounds a channel. A fin channel structure does not go beyond the established manufacturing technique but can be manufactured to have a three-dimensional structure. Due to its structural characteristic, the fine channel structure has a good gate control capacity to reduce the short channel effect, thereby minimizing the effect between the drain region and the source region. Additionally, the fin channel structure can reduce the channel doping concentration, thereby preventing leakage current through a junction region.

In order to form the fin-type transistor, a damascene method such as a method of exposing both sides of the active region has been is generally used. The process includes forming a device isolation region to set the active region and recessing a partial surface of the device isolation region. A gate line is formed in a recess groove formed in the device isolation region so that the gate may be disposed on both side surfaces of the active region.

Meanwhile, the entire resistance of the fin-type gate is determined by the channel resistance and resistance in the source and drain region. Generally, the resistance of the source and drain region of the fin-type gate is determined by an interface between metal silicide and silicon formed in a silicon part of the source and drain region.

BRIEF SUMMARY OF THE INVENTION

Various embodiments of the invention are directed to preventing increase of the entire resistance due to increase of resistance in the source and drain region in a semiconductor device comprising a fin-type gate that has a fin channel structure where a three-side gate surrounds a channel, thereby improving degradation of characteristics of the semiconductor device.

According to an embodiment of the present invention, a semiconductor device comprises: an active region having an upper portion and a sidewall portion which are protruded from the top surface of a device isolation region; and a silicide film disposed over the upper portion and the sidewall portion of the active region.

The semiconductor device further comprises a gate line disposed over the active region.

The gate line includes a gate oxide film, a gate layer and a gate hard mask layer.

The semiconductor device further comprises an interlayer insulating film planarized with the gate line over the device isolation region.

The semiconductor device further comprises a landing plug connected to the top surface of the silicide film and planarized with the interlayer insulating film.

According to an embodiment of the present invention, a method for manufacturing a semiconductor device comprises: forming a device isolation region in a semiconductor substrate; forming a trench in the device isolation region to protrude an upper portion and a sidewall portion of an active region; and forming a silicide film in the upper portion and the sidewall portion of the active region.

After forming a device isolation region, the method further comprises forming a gate line buried in the device isolation region.

The forming-a-gate-line includes: forming a recess in the device isolation region; forming a gate oxide film on the device isolation region including the recess and the active region; forming a gate layer on the upper portion of the gate oxide film; forming a gate hard mask layer on the upper portion of the gate layer; and forming a photoresist pattern on the gate hard mask to perform a patterning process with the photoresist pattern as an etching mask.

After forming a gate line includes: forming a source/drain region in the active region at a side of gate line.

The forming-a-silicide-film includes: forming a metal layer on the gate line, the isolation region and the active region, the metal layer being in contact with the source/drain region of the active region; performing a thermal process to react the active region with the metal layer; and selectively removing the metal layer that does not react with the active region.

The metal layer is formed by a chemical vapor deposition (CVD) process.

The forming-a-metal-layer includes forming Ti, Co or Ni.

After forming-a-silicide-film, the method further comprises forming a landing plug connected to the silicide film.

The forming-a-landing-plug includes: forming an interlayer insulating film on the gate line, the device isolation region and the active film including the silicide film; etching the interlayer insulating film to expose the silicide film; forming a conductive material on the silicide film; and performing a planarizing process on the conductive material to expose the interlayer insulating film.

The active region is formed at a higher level than the device islation region.

The active region formed to have a fin shape having a top surface formed at a higher level than the device islation region and a sidewall extending from the top surface of the active region to the device isolation region, wherein the silicide film is formed over the top surface and the is sidewall of the active region, and wherein the source/drain region is formed over the active region.

In one embodiment, a semiconductor device includes a substrate including an active region and a device isolation region; a fin-shaped gate pattern formed in the active region; a source/drain pattern formed in the substrate at a side of the fin-shaped gate in the active region; a conductive pattern electrically coupled to the source/drain region; and a silicide film formed between the source/drain pattern and the conductive pattern, the silicide film formed in the active region. The silicide film is formed external to the device isolation region. The active region is formed at a higher level than the device isolation region. The active region has a fin shape having a top surface formed at a higher level than the device isolation region and a sidewall extending from the top surface of the active region to the device isolation region, wherein the silicide film is formed over the top surface and the sidewall of the active region, and wherein the source/drain pattern is formed over the top surface of the active region.

DESCRIPTION OF EMBODIMENTS

The present invention will be described in detail with reference to the attached drawings.

Figure 1:
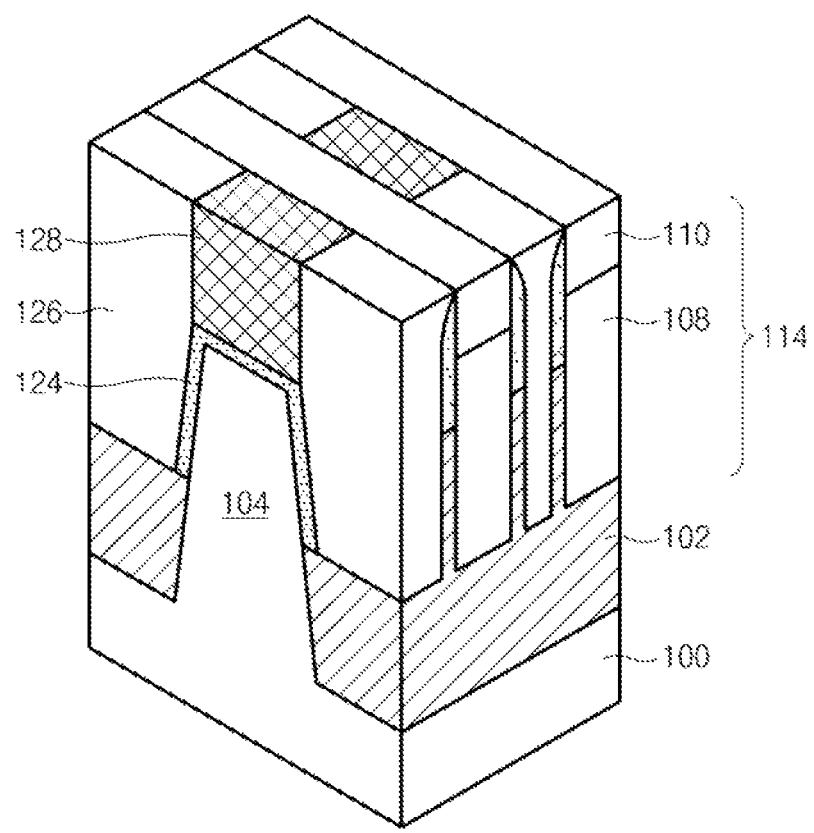
FIG. 1 is a cross-sectional diagram illustrating a semiconductor device according to an embodiment of the present invention.

FIG. 1 is a cross-sectional diagram illustrating a semiconductor device according to an embodiment of the present invention.

Referring to FIG. 1, a semiconductor device includes a device isolation region 102 buried in a trench obtained by etching a given thickness of a semiconductor substrate 100, an active region 104 having an upper portion and a sidewall portion which are protruded from the top surface of the device isolation region 102, a silicide film 124 formed in the upper portion and the sidewall portion of the active region 104, an interlayer insulating film 126 formed on the upper portion of the device isolation region 102, a gate line 114 disposed between the interlayer insulating films 126 to divide the active region 104 into three regions to have a height planarized with the interlayer insulating film 126, and a landing plug 128 connected to the silicide film 124 and planarized with the gate line 114. The gate line 114 has a stacked structure including a gate oxide film (not shown), a gate layer 108 and a gate hard mask layer 110. The silicide film 124 is obtained by performing a thermal process on the active region 104 and a metal layer (not shown) formed over the upper portion and the sidewall portion of the active region 104. The metal layer (not shown) includes any of Ti, Co or Ni, which is formed by a chemical vapor deposition (CVD) process. A dopant implanting region (not shown) may be formed in the active region 104.

The semiconductor device of FIG. 1 includes the silicide film formed in the upper portion and the sidewall portion of the active region to prevent an increase of resistance of a source and drain region of a fin-type gate.

FIGS. 2a to 2j are cross-sectional diagrams illustrating a method for manufacturing a semiconductor device according to an embodiment of the present invention.

Figure 2A:
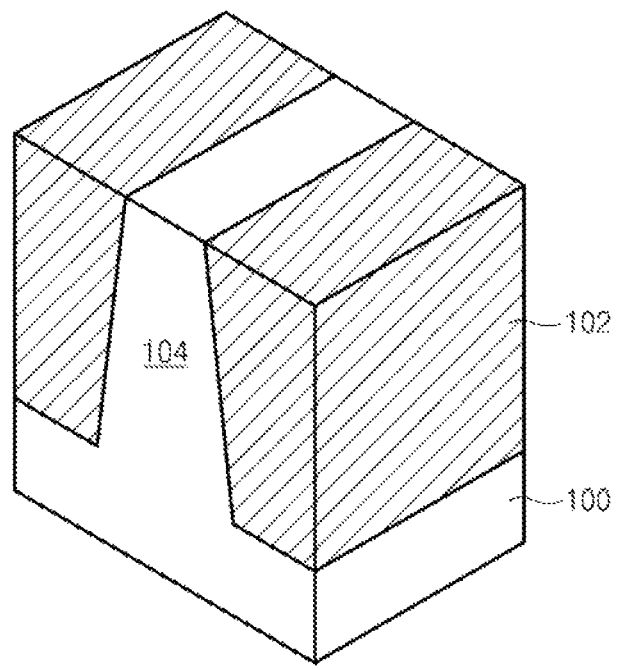
FIGS. 2a to 2j are cross-sectional diagrams illustrating a method for manufacturing a semiconductor device according to an embodiment of the present invention.

Referring to FIG. 2a, after a given thickness of the semiconductor device 100 is etched to form a trench (not shown), an insulating material is buried in the trench (not shown) to form the device isolation region 102. The active region 104 is defined by the device isolation region 102 formed in the semiconductor substrate 100. The active region 104 includes an insulating material field oxide film.

Figure 2B:
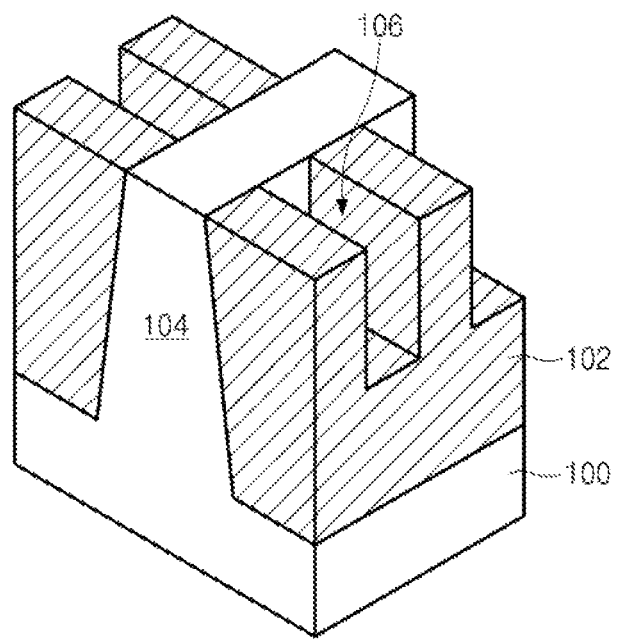

Referring to FIG. 2b, a photoresist pattern (not shown) that defines a fin-type gate region is formed on the semiconductor substrate 100 including the device isolation region 102. A given thickness of the device isolation region 102 is etched with the photoresist pattern (not shown) to form a recess 106.

Figure 2C:
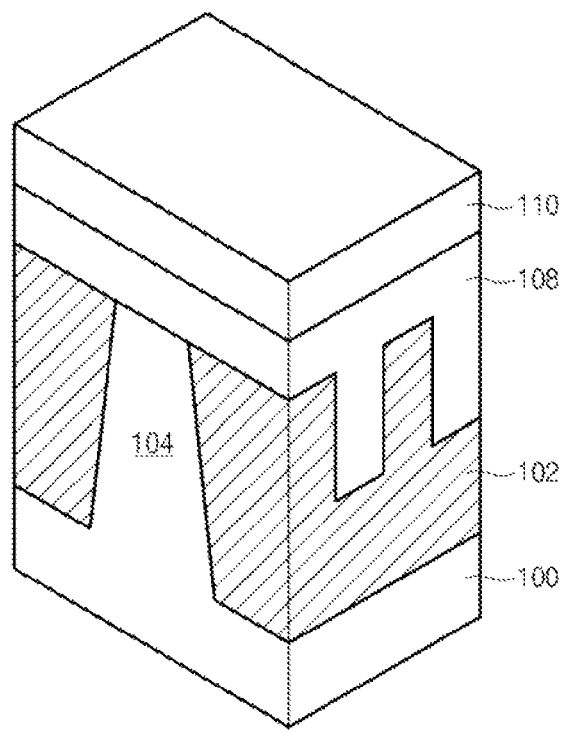

Referring to FIG. 2c, the gate oxide film (not shown), the gate layer 108 and the gate hard mask layer 110 are formed on the device isolation region 102 including the recess 106.

Figure 2D:
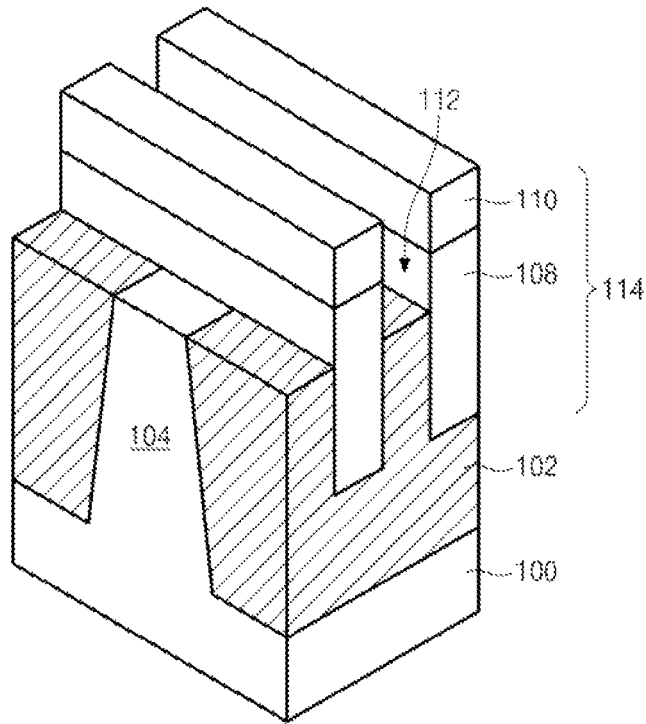

Referring to FIG. 2d, a photoresist pattern (not shown) to define a gate line is formed on the gate hard mask layer 110. The gate hard mask layer 110 is etched with the photoresist pattern (not shown) as an etching mask. The gate layer 108 and the gate oxide film (not shown) are etched with the gate hard mask layer as an etching mask to form a gate line 114.

Figure 2E:
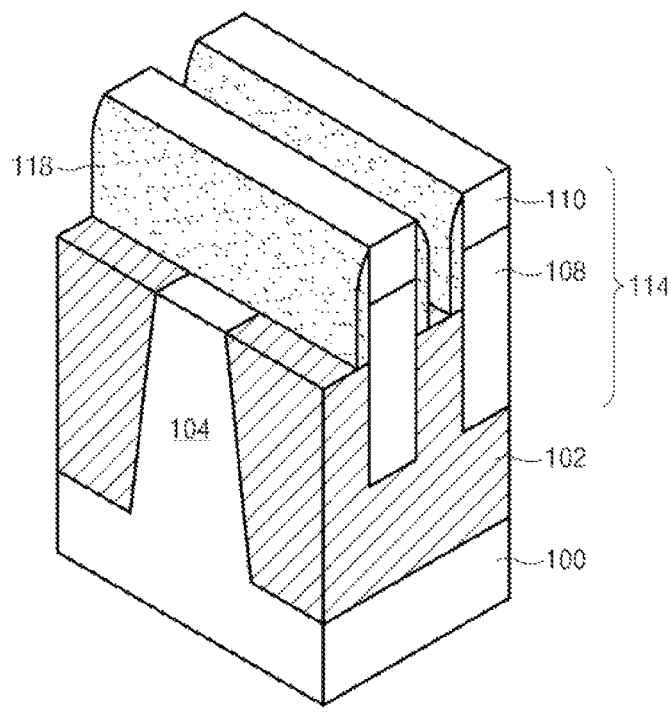

Referring to FIG. 2e, a gate spacer material is deposited on the gate line 114. An etch-back process is performed on the gate spacer material to form a gate spacer 118 over the sidewall of the gate line 114. A source/drain region (not shown) formed in the active region.

Figure 2F:
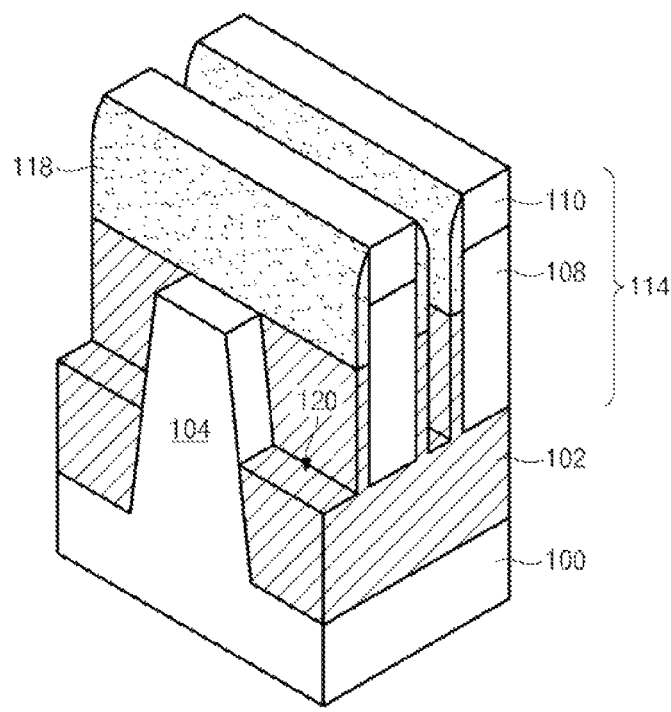

Referring to FIG. 2f, a given thickness of the device isolation region 102 is etched with the gate line 114 including the gate spacer 118 as an etching mask to form a trench 120. The depth of the trench 120 is identical with that of the recess 106 formed to define the fin-type gate region so that the device isolation region 102 disposed in a source and drain peripheral region may be removed. That is, the upper portion and the sidewall portion of the active region 104 are protruded by the trench 120. Accordingly, the active region 104 is formed at a higher level than the device isolation region 102. The active region 104 formed to have a fin shape having a top surface formed at a higher level than the device isolation region 102 and a sidewall extending from the top surface of the active region 104 to the device isolation region 102, A dopant implanting region (not shown) may be formed in the protruded active region 104 so that a silicide layer formed in a subsequent process can form an ohmic-contact.

Figure 2G:
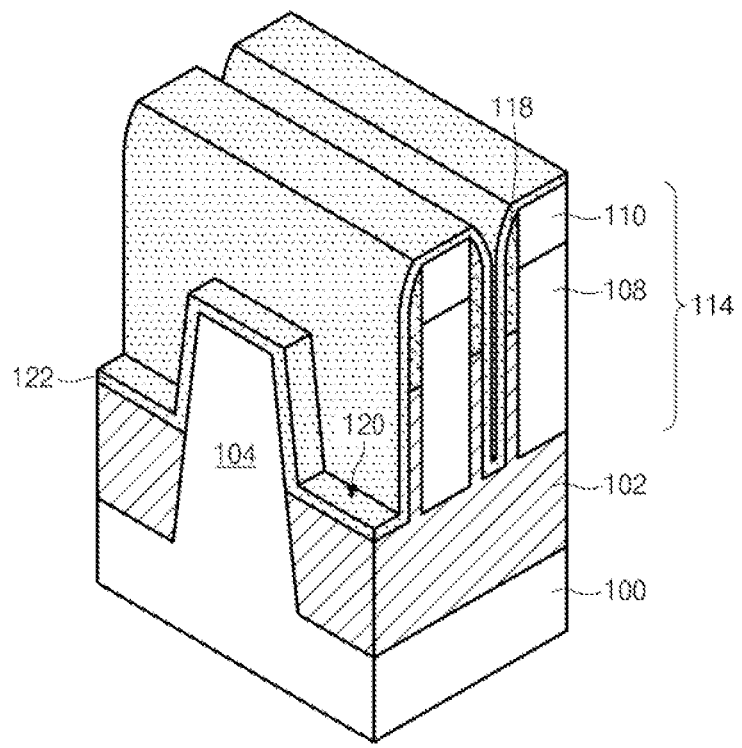

Referring to FIG. 2g, a metal layer 122 is formed on the trench 120. The metal layer 122 is formed by a chemical vapor deposition (CVD) process. The metal layer 122 can be formed of Ti, Co or Ni.

Figure 2H:
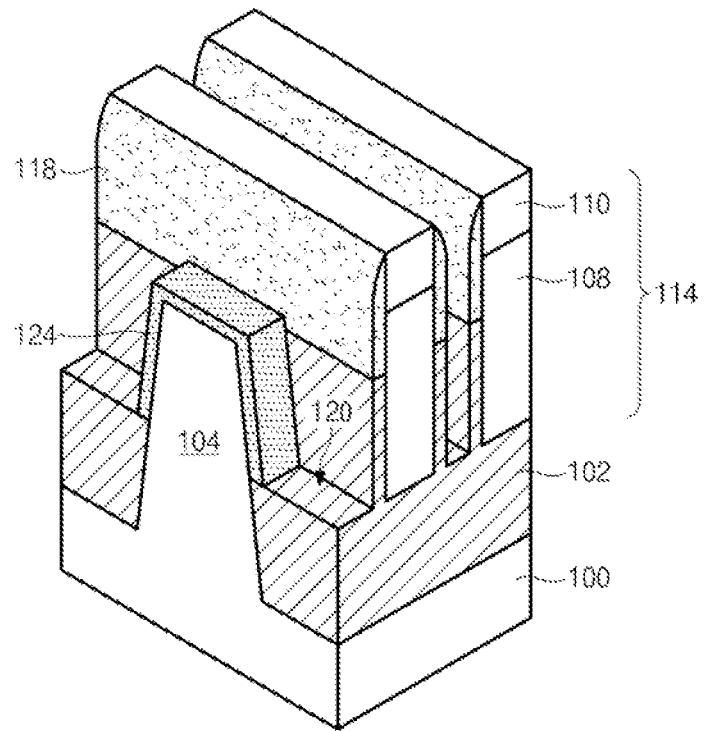

Referring to FIG. 2h, a thermal process is performed to form the silicide film 124 in the upper portion and the sidewall portion of the active region 104. The silicide film 124 is formed only on the upper portion of the active region 104 because the active region 104 has a silicon substrate which is in contact with the metal layer 122 (see FIG. 2g). The silicide film 124 is formed between the source/drain region and the gate pattern 114, the silicide film 124 formed in the active region 104. That is, when a thermal process is performed after the metal layer 122 (see FIG. 2g) is formed, the device isolation region 102 which includes no silicon substrate in contact with the metal layer 122 (see FIG. 2g) is not subject to the silicide reaction. The unsilicidized metal layer is selectively removed. The silicide film 124 may be formed only over the upper portion and the sidewall of the substrate pattern in the active region 104.

Figure 2I:
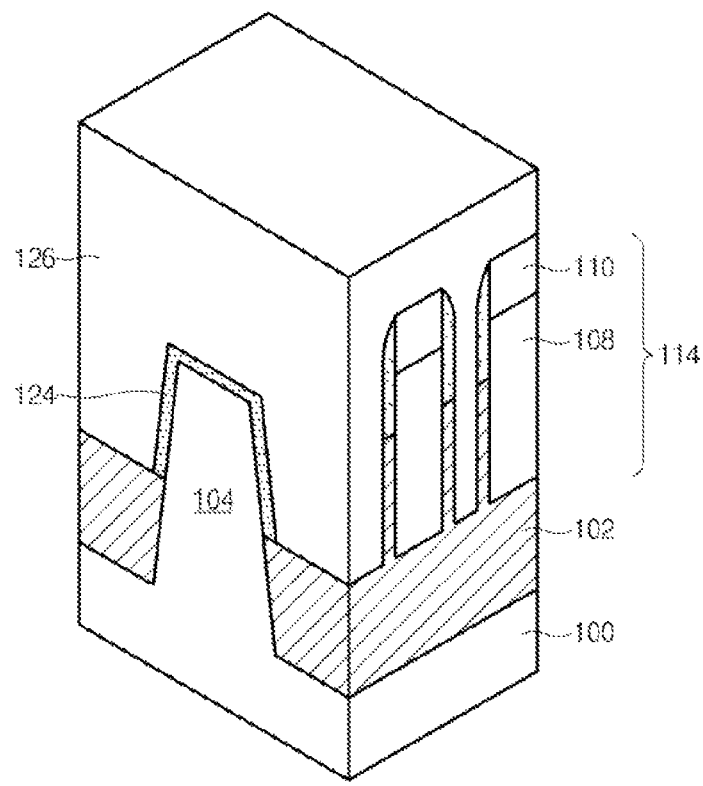

Referring to FIG. 2i, the interlayer insulating film 126 is formed on the gate line 114, the isolation region 102 and the active region 104 including the silicide film 124 so that a gap between the silicide film 124 and the gate line 114 may be filled.

Figure 2J:
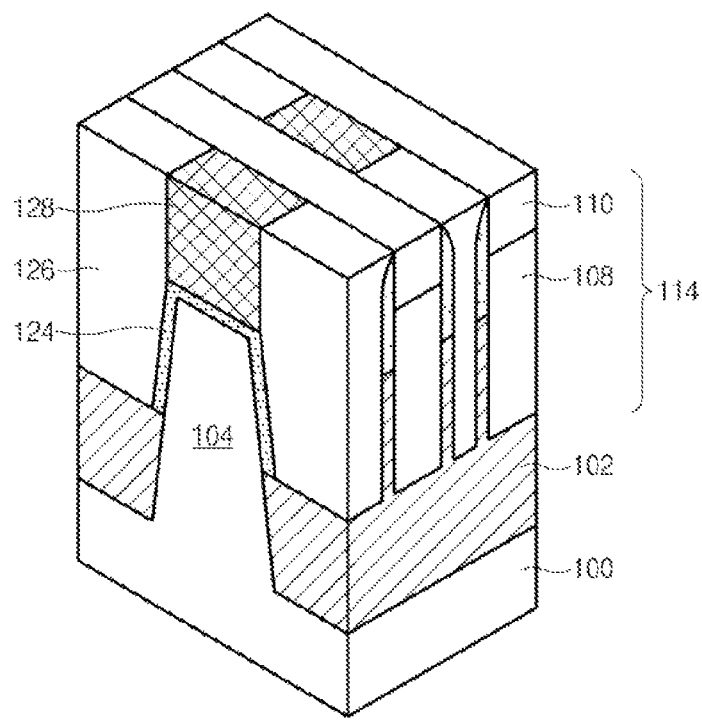

Referring to FIG. 2j, a planarizing process is performed on the interlayer insulating film 126 to expose the gate line 114.

A photoresist pattern (not shown) that defines a landing plug hole is formed on the planarized upper portion of the interlayer insulating film 126. The interlayer insulating film 126 is etched with the photoresist pattern (not shown) as an etching mask to expose the silicide layer 124. A conductive material is buried so that the landing plug hole (not shown) may be filled to form a landing plug 128.

That is, the above-described method includes exposing the upper portion and the sidewall of the active region, and performing a thermal process to form the silicide film by reaction with the metal layer formed on the upper portion and the sidewall of the active region, thereby reducing resistance of the source and drain region to improve characteristics of the semiconductor device.

As described above, a semiconductor device and a method for manufacturing the same according to an embodiment of the present invention can effectively reduce resistance in a source and drain region of the semiconductor device, thereby reducing the entire resistance of the semiconductor device comprising a fin-type gate to improve characteristics of the semiconductor device.

The above embodiments of the present invention are illustrative and not limitative. Various alternatives and equivalents are possible. The invention is not limited by the type of deposition, etching polishing, and patterning steps describe herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
    forming a device isolation region in a semiconductor substrate;
    forming a gate line buried in the device isolation region;
    etching the device isolation region to form a trench in the device isolation region using the gate line as an etching mask so that an upper portion and a sidewall portion of an active region are exposed; and
    forming a silicide film over the upper portion and the sidewall portion of the active region.

2. The method according to claim 1, wherein the step of forming the gate line includes:
    forming a recess in the device isolation region;
    forming a gate oxide film over the device isolation region including the recess and the active region;
    forming a gate layer over an upper portion of the gate oxide film;
    forming a gate hard mask layer over the upper portion of the gate layer; and
    forming a photoresist pattern over the gate hard mask and performing a patterning process using the photoresist pattern as an etching mask.

3. The method according to claim 2, after the step of forming the gate line, the method further includes:
    forming a source/drain region in the active region at a side of the gate line.

4. The method according to claim 3, wherein the step of forming the silicide film includes:
    forming a metal layer over the gate line, the isolation region, and the upper portion and the sidewall portion of the active region, the metal layer being in contact with the source/drain region of the active region;
    performing a thermal process to react the active region with the metal layer; and
    selectively removing the metal layer that did not react with the active region.

5. The method according to claim 4, wherein the metal layer is formed using a chemical vapor deposition (CVD) process.

6. The method according to claim 4, wherein the metal layer includes any of Ti, Co, and Ni.

7. The method according to claim 1, after the step of forming the silicide film, the method further comprising:
    forming a landing plug coupled to the silicide film.

8. The method according to claim 7, wherein the step of forming the landing plug includes:
    forming an interlayer insulating film over the gate line, the device isolation region, and the active region including the silicide film;
    etching the interlayer insulating film to expose the silicide film;
    forming a conductive material over the silicide film; and
    performing a planarizing process over the conductive material to expose the interlayer insulating film.

9. The method according to claim 1, wherein the active region is formed at a higher level than the device isolation region.

10. The method according to claim 1, wherein the active region is formed to have a fin shape having a top surface formed at a higher level than the device isolation region and a sidewall extending from the top surface of the active region to the device isolation region,
    wherein the silicide film is formed over the top surface and the sidewall of the active region, and
    wherein the source/drain region is formed over the active region.

* * * * *